[12] United States Patent
Dargis et al.

(10) Patent No.: US 11,063,114 B2
(45) Date of Patent: Jul. 13, 2021

(54) III-N TO RARE EARTH TRANSITION IN A SEMICONDUCTOR STRUCTURE

(71) Applicant: IQE plc, Cardiff (GB)

(72) Inventors: Rytis Dargis, Greensboro, NC (US); Andrew Clark, Mountain View, CA (US); Rodney Pelzel, Emmaus, PA (US); Michael Lebby, Apache Junction, AZ (US); Robert Yanka, Kernersville, CA (US)

(73) Assignee: IQE plc, Cardiff (GB)

( * ) Notice: Subject to any disclaimer, the term of this patent is extended or adjusted under 35 U.S.C. 154(b) by 0 days.

(21) Appl. No.: 16/688,162

(22) Filed: Nov. 19, 2019

(65) Prior Publication Data

US 2020/0161417 A1 May 21, 2020

Related U.S. Application Data

(60) Provisional application No. 62/769,951, filed on Nov. 20, 2018.

(51) Int. Cl.
*H01L 29/04* (2006.01)
*H01L 29/15* (2006.01)
*H01L 29/20* (2006.01)
*H01L 21/02* (2006.01)

(52) U.S. Cl.
CPC .......... *H01L 29/04* (2013.01); *H01L 21/0254* (2013.01); *H01L 21/02381* (2013.01); *H01L 21/02433* (2013.01); *H01L 21/02502* (2013.01); *H01L 29/15* (2013.01); *H01L 29/2003* (2013.01)

(58) Field of Classification Search
CPC ............... H01L 29/04; H01L 21/02381; H01L 21/02433; H01L 21/02502; H01L 21/0254
See application file for complete search history.

(56) References Cited

U.S. PATENT DOCUMENTS

| | | | |
|---|---|---|---|
| 8,633,569 B1 | 1/2014 | Arkun et al. | |
| 9,142,406 B1 | 9/2015 | Dargis et al. | |
| 9,917,193 B2 | 3/2018 | Dargis et al. | |
| 2008/0296529 A1* | 12/2008 | Akiyama | H01L 41/1136 252/62.9 PZ |
| 2014/0246679 A1 | 9/2014 | Arkun et al. | |
| 2015/0203990 A1 | 7/2015 | Dargis et al. | |

(Continued)

OTHER PUBLICATIONS

Holec et al (2008). Equilibrium critical thickness for misfit dislocation in III-nitrides. Journal of Applied Physics, 104, 123514-1 to 123514-7 (Year: 2008).*

(Continued)

*Primary Examiner* — Feifei Yeung Lopez
(74) *Attorney, Agent, or Firm* — Sterne, Kessler, Goldstein & Fox P.L.L.C.

(57) ABSTRACT

In view of the high-temperature issues in III-N layer growth process, embodiments described herein use layered structure including a rare earth oxide (REO) or rare earth nitride (REN) buffer layer and a polymorphic III-N-RE transition layer to transit from a REO layer to a III-N layer. In some embodiments, the piezoelectric coefficient of III-N layer is increased by introduction of additional strain in the layered structure. The polymorphism of RE-III-N nitrides can then be used for lattice matching with the III-N layer.

22 Claims, 11 Drawing Sheets

(56) References Cited

U.S. PATENT DOCUMENTS

2015/0228484 A1  8/2015  Dargis et al.

OTHER PUBLICATIONS

Zukauskaite et al., Stabilization of wurtzite $Sc_{0.4}Al_{0.6}N$ in pseudomorphic epitaxial $Sc\alpha Al1_{-\chi}N/In_\gamma Al_{1-\gamma}N$ superlattices, Science Direct, Acta Materialia, 94:101-110 (2015).

Alsaad et al., "Structural phase transitions and piezoelectric anomalies in ordered $Sc_{0.5}Ga_{0.5}N$ Alloys", Bull. Mater. Sci., vol. 30, No. 4, Aug. 2007, pp. 407-413.

Dai et al., "Effects of indium surfactant on growth and characteristics of (1122) plan AlGaN-based multiple quantum wells," Optical Materials Express, vol. 8, 309687 (2017).

* cited by examiner

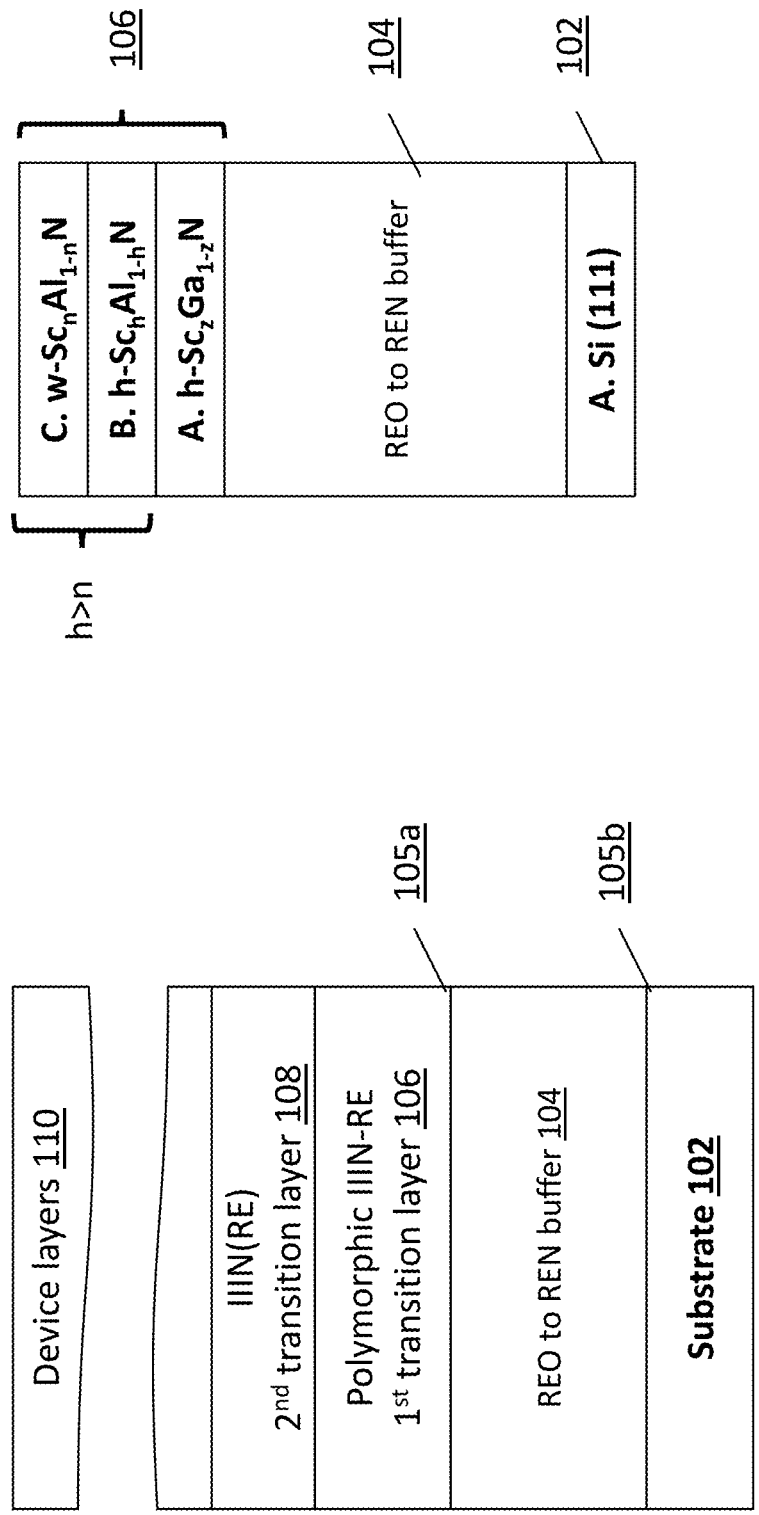

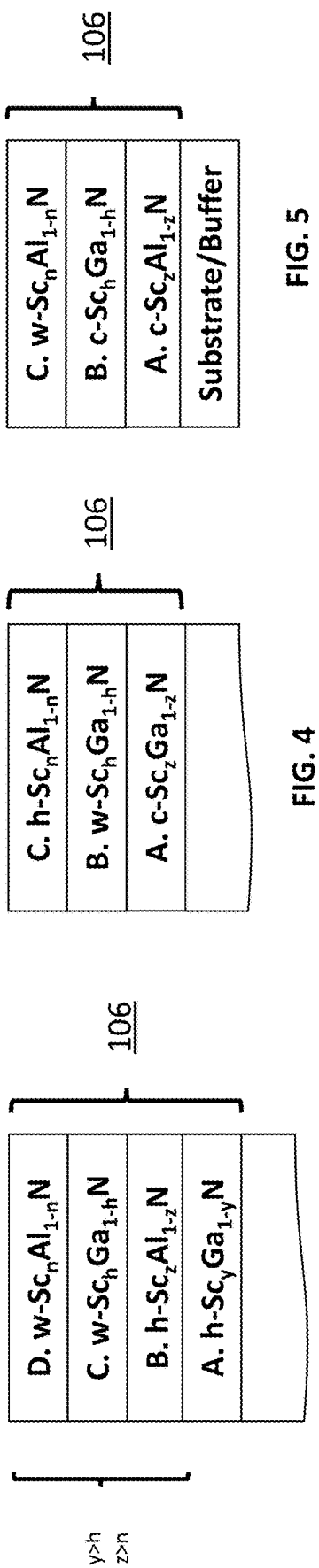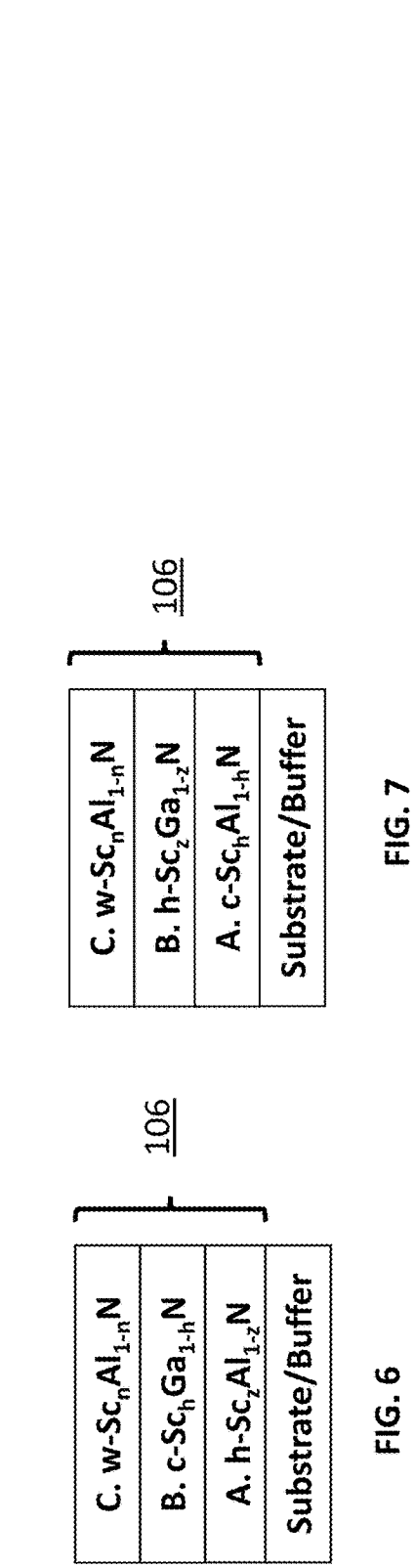

III-N TO RARE EARTH TRANSITION IN A SEMICONDUCTOR STRUCTURE

CROSS-REFERENCE TO RELATED APPLICATIONS

This disclosure claims the benefit under 35 U.S.C. § 119(e) of U.S. Provisional Patent Application No. 62/769,951, filed Nov. 20, 2018, which is hereby incorporated by reference herein in its entirety.

BACKGROUND

Existing semiconductor structures usually have gallium nitride (GaN) or other III-N based electronics and optoelectronics grown on a silicon substrate, as silicon substrates are generally cost-efficient.

However, growing a III-N material on a silicon substrate has traditionally been difficult due in large part to the large crystal lattice mismatch and the huge difference in thermal expansion coefficients between silicon and GaN. Specifically, existing III-N growth process usually relies on high temperatures to grow III-N layers of a quality sufficient to yield decent device performance. Tensile stress may in turn increase during the III-N growth process under a high temperature and during the subsequent cooling of the structure.

While adding rare earth atoms into III-N layers having a wurtzite lattice introduces additional strain into the lattice constant resulting in an increased piezoelectric coefficient of the III-N layers because the bonds around the rare earth atoms are distorted which results in stronger polarization along the c-axis, on the other hand addition of rare earth atoms to the III-N layers also transforms the crystal structure from wurtzite to cubic. Therefore, it is important to increase the piezoelectric coefficient of the material without increasing the rare earth concentration beyond a critical level causing the transformation of the crystal structure.

Additional existing III-N growth processes include single composition of III-Ns that are deposited as piezoelectric layers. Such piezoelectric coefficient properties which defines coupling coefficient of electroacoustic devices (RF filters) are intrinsic.

Existing methods to grow III-N layers at a relatively low temperature include using nitrogen plasma to modify a layer of epitaxial rare earth oxide grown over the substrate, and then growing a layer of low temperature GaN on the modified surface of the rare earth oxide. Further discussion on using a nitrogen plasma to grow low temperature GaN is provided in commonly-owned U.S. Pat. No. 9,917,193, issued Mar. 13, 2018. Additional existing methods to grow III-N layers include using a single crystal silicon or a single crystal sapphire as a substrate to grow III-N material. Further embodiments are discussed in commonly-owned U.S. Pat. No. 9,142,406, issued Sep. 22, 2015. The aforementioned patents are hereby expressly incorporated by reference herein by their entireties.

SUMMARY

A layered structure for III-N to rare earth transition is provided. Specifically, the layered structure includes a substrate, a rare earth oxide or rare earth nitride buffer layer over the substrate, a first III-N rare earth transition layer over the rare earth oxide or rare earth nitride buffer layer, and a second III-N rare earth transition layer over the first III-N rare earth transition layer.

In some embodiments, the rare earth oxide or rare earth nitride buffer layer has a first lattice constant at an upper surface of the rare earth oxide or rare earth nitride buffer layer and a second lattice constant at a lower surface of the rare earth oxide or rare earth nitride buffer layer. The first lattice constant is less than the second lattice constant.

In some embodiments, the first III-N rare earth transition layer includes at least three sublayers with ScAlN, ScGaN In some embodiments, each of the multiple sublayers has one of a cubic structure, a simple hexagonal structure, or a wurtzite hexagonal structure.

In some embodiments, the piezoelectric coefficient is increased by introduction of in-plane compressive strain which would introduce tensile strain of the crystal lattice in out-of-plane direction along c-axis of hexagonal structure.

In some embodiments, the second III-N rare earth transition layer is composed of AlN grown with Sc as surfactant.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which:

FIG. 1 shows an example layered structure having transition layers to grow III-N materials, in accordance with an embodiment of the present disclosure;

FIG. 2 shows an example composition of a layered structure similar to the structure shown in FIG. 1, in accordance with one embodiment of the present disclosure;

FIG. 3 shows another example composition of the first transition layer shown in the layered structure in FIG. 1, in accordance with one embodiment of the present disclosure;

FIGS. 4-7 show various example compositions of the first transition layer that facilitates stress-tuning the epitaxial structure shown in FIG. 1, in accordance with some embodiments of the present disclosure;

DETAILED DESCRIPTION

Figure 9:
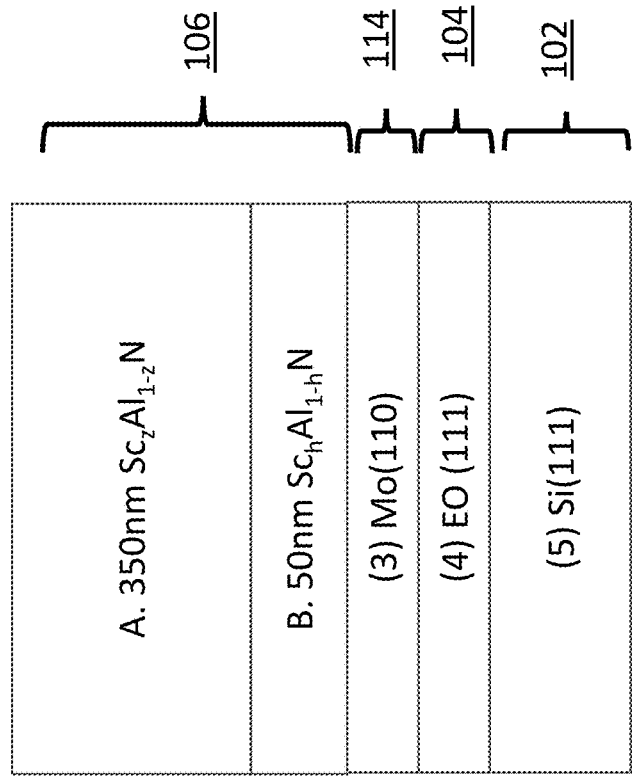
FIG. 9 shows an example composition of the first transition layer and the second transition layer shown in the layered structure that facilitates stress-tuning the epitaxial structure shown in FIG. 1, in accordance with one embodiment of the present disclosure.

In view of the high-temperature issues in III-N layer growth process, embodiments described herein use a rare earth oxide (REO) to rare earth nitride (REN) buffer and a polymorphic III-N-RE transition layer to transit from a REO layer to a III-N layer. The polymorphism of RE-III-N nitrides can then be used for lattice matching with the III-N layer.

FIG. 1 shows an example layered structure having transition layers to grow III-N materials, according to an embodiment described herein. The layered structure 100 may start with a substrate 102, on which a REO-REN buffer layer 104 is grown. The REO-REN buffer layer 104 has an in-plane lattice constant at the upper surface 105a, which is less than the in-plane lattice constant at the substrate-buffer interface 105b. A first transition layer 106 is grown over the REO-REN buffer layer 104. The first transition layer 106 is composed of polymorphic RE-III-N, which is an alloy (or alloys) with a controllable crystal structure based on control of the growth process. For example, when the first transition layer 106 takes different crystal forms such as cubic, hexagonal or wurtzite, the in-plane lattice spacing in the first transition layer 106 may vary accordingly. Lattice constants of example polymorphic RE-III-N materials of different crystal structures (e.g. cubic structure "c-," simple hexagonal structure (BN) "h-," or wurtzite hexagonal structure "w-"), are provided in Table 1 below:

TABLE 1

Example Lattice Constants of Polymorphic III-N

|   | c-ScN | h-ScN (BN) | w-ScN | GaN | AlN |
|---|---|---|---|---|---|
| a | 4.52 | 3.66 | 3.45 | 3.189 | 3.112 |
| c | — | 4.42 | 5.52 | 5.186 | 4.981 |
| c-ScN $a_{111}$ | 3.196 | — | — | | |

As shown in Table 1, the lattice constant a of hexagonal ScN is greater than that of wurtzite ScN, which is in turn greater than that of cubic ScN having a crystal orientation of <111>, which is in turn greater than that of wurtzite GaN, which is in turn greater than that of wurtzite AlN. Additional example lattice constants of different materials such as $Sc_xAl_{(1-x)}N$ or $Sc_xGa_{(1-x)}N$ of different crystal structures can be found in Table 2. For example, $Sc_xAl_{(1-x)}N$ may take a form of cubic, hexagonal or wurtzite structure depending on the composition (the ratio between Al and Sc). Generally, the hexagonal structure is quasi-stable at particular growth conditions (e.g., lower substrate temperature). In addition, hexagonal (non-polar) structure with a c/a lattice constant ratio of approximately 1.2 is more stable than wurtzite when Sc mole fraction is greater than 0.5.

TABLE 2

Example Lattice Constants of Polymorphic RE-III-N

| x | w-$Sc_xAl_{(1-x)}N$ | w-$SC_xGa_{(1-x)}N$ | c-$Sc_xAl_{(1-x)}N$ | c-$Sc_xGa_{(1-x)}N$ |
|---|---|---|---|---|
|  | a 3.112 | a 3.189 | a (111) $3.98*2^{-1/2}$ | a (111) $4.1*2^{-1/2}$ |
| 0 | 3.112 | 3.189 | 2.814 | 2.899 |
| 0.1 | 3.1458 | 3.2151 | 2.8522 | 2.9287 |
| 0.2 | 3.1796 | 3.2412 | 2.8904 | 2.9584 |
| 0.3 | 3.2134 | 3.2673 | 2.9286 | 2.9881 |
| 0.4 | 3.2472 | 3.2934 | 2.9668 | 3.0178 |
| 0.5 | 3.281 | 3.3195 | 3.005 | 3.0475 |
| 0.6 | 3.3148 | 3.3456 | 3.0432 | 3.0772 |
| 0.7 | 3.3486 | 3.3717 | 3.0814 | 3.1069 |
| 0.8 | 3.3824 | 3.3978 | 3.1196 | 3.1366 |
| 0.9 | 3.4162 | 3.4239 | 3.1578 | 3.1663 |
| 1 | 3.45 | 3.45 | 3.196 | 3.196 |

As shown in Table 2, the in-plane lattice constant of cubic ScAlN (111) is smaller than the lattice constant of wurtzite ScAlN, which allows stress engineering in multilayer structures. For example, when the first transition layer is composed of ScAlN, the crystal structure of ScAlN can be chosen to be different at the upper surface and the lower surface of the first transition layer 106, in order to balance the stress across layers when the two surfaces of the transition layer 106 have different lattice constants. The variation in spacing at the first transition layer 106 may be used for dislocation annihilation closer to interface due to engineered lattice mismatch which provide for a better quality of the III-N layer 108 grown above.

A second transition layer 108 is grown over the first transition layer 106. The second transition layer uses rare earth (RE) doping to control surface mobilities of the arriving elemental species and localized manipulation of lattice dynamics. Additional device layers 110 may be grown or disposed over the second transition layer, directly or indirectly.

FIG. 2 shows an example composition of a layered structure similar to 100 in FIG. 1, according to one embodiment described herein. The substrate 102 may be a silicon substrate having a crystal orientation of <111>. The first transition layer 106 may include III-N semiconductors grown on polymorphic RE compounds, including sublayers A-C of h-$Sc_aGa_{(1-a)}N$, h-$Sc_hAl_{(1-h)}N$ and w-$Sc_nAl_{(1-n)}N$, respectively, where the coefficients h is chosen to be greater than n, and the resulting in-plane lattice constants of the sublayers satisfy A>B>C. Specifically, h-ScGaN material can be inserted between sublayers A and B for a smooth lattice constant transition.

FIG. 3 shows another example composition of the first transition layer shown in the layered structure in FIG. 1, according to one embodiment described herein. As shown in FIG. 3, the first transition layer 106 may be based on RE-III-N alloys, e.g., comprising four sublayers A-D of h-$Sc_yGa_{(1-y)}N$, h-$Sc_zAl_{(1-z)}N$, w-$Sc_hGa_{(1-h)}N$, and w-$Sc_nAl_{(1-n)}N$, respectively. The coefficients y, z, h, and n are chosen such that (i) y>h, z>n; and (ii) the resulting lattice constants of the sublayers satisfy A>B>C>D. Specifically, h-ScAlGaN could be inserted between sublayers A and B, and w-ScAlGaN can be inserted between C and D for smooth lattice constant transitions.

FIGS. 4-17 show various example compositions for the first transition layer that facilitates stress-tuning of the epitaxial structure shown in FIG. 1, according to embodiments described herein. In the example shown in FIG. 4, the first transition layer 106 includes sublayers A-C of c-$Sc_zGa_{(1-z)}N$, w-$Sc_hGa_{(1-h)}N$, and h-$Sc_fAl_{(1-n)}N$. The coefficients z, h, and n are chosen such that (i) the resulting lattice constants of the sublayers satisfy A<B<C; (ii) the sublayer A is under tensile stress because its lattice constant is smaller than the lattice constant of the substrate 102 or buffer 104; and (iii) the sublayers B and C are under compressive stress. Example coefficients can be set as z between 0.95-1.0, h between 0-0.1, n between 0.1-0.25. In some implementations, h is required to set as a low value for stabilization of wurtzite structure of sublayer B. Critical thickness of sublayers B and C can be large due to close lattice matching.

In the example shown in FIG. 5, the first transition layer 106 includes sublayers A-C of c-$Sc_zAl_{(1-z)}N$, c-$Sc_hGa_{(1-h)}N$, and w-$Sc_nAl_{(1-n)}N$. The coefficients z, h, and n are chosen such that (i) the resulting lattice constants of the sublayers satisfy A<B<C; (ii) the sublayer A is under tensile stress because its lattice constant is smaller than the lattice constant of the substrate 102 or buffer 104; and (iii) the sublayers B and C are under compressive stress. Example coefficients can be set as z between 0.5-0.87, h between 0.5-0.85, n between 0-0.15. In some implementations, critical thickness of sublayers B and C can be large due to close lattice matching.

In the example shown in FIG. 6, the first transition layer 106 includes sublayers A-C of h-$Sc_zAl_{(1-z)}N$, c-$Sc_hGa_{(1-h)}N$, and w-$Sc_nAl_{(1-n)}N$. The coefficients z, h, and n are chosen such that (i) the resulting lattice constants of the sublayers satisfy A>B<C; (ii) the sublayer A is under tensile stress because its lattice constant is smaller than the lattice constant of the substrate 102 or buffer 104; (iii) the sublayer B is under tensile stress because its lattice constant is smaller than that of sublayer A; and (iv) the sublayer C is under compressive stress because its lattice constant is larger than that of sublayer B. Example coefficients can be set as z between 0.1-0.5, h between 0.5-0.85, n between 0-0.15. In some implementations, critical thickness of sublayer C can be large due to close lattice matching.

In the example shown in FIG. 7, the first transition layer 106 includes sublayers A-C of c-$Sc_hAl_{(1-h)}N$, h-$Sc_zGa_{(1-z)}N$, and w-$Sc_nAl_{(1-n)}N$. The coefficients z, h, and n are chosen such that (i) the resulting lattice constants of the sublayers satisfy A>B>C; (ii) the sublayer A is under tensile stress because its lattice constant is smaller than the lattice constant of the substrate 102 or buffer 104; (iii) the sublayer B is under compressive stress because its lattice constant is larger than that of sublayer A; and (iv) the sublayer C is under tensile stress because its lattice constant is smaller than that of sublayer B. Example coefficients can be set as h between 0.5-0.75, z between 0.10-0.5, n between 0-0.15. In some implementations, critical thickness of sublayer C can be large due to close lattice matching.

Figure 8:
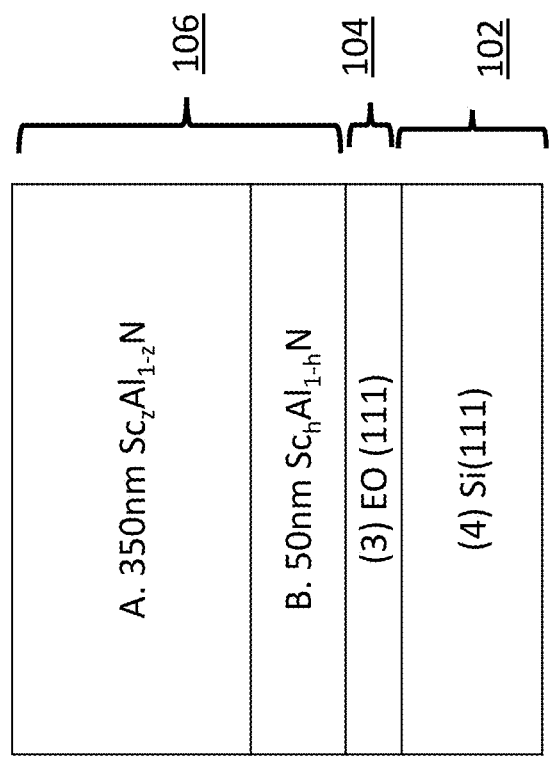
FIG. 8 shows an example composition for the first transition layer and the second transition layer shown in the layered structure that facilitates stress-tuning of the epitaxial structure shown in FIG. 1, in accordance with one embodiment of the present disclosure.

In the example shown in FIG. 8, the first transition layer 106 includes sublayers A and B of $Sc_zAl_{(1-z)}N$ and $Sc_hAl_{(1-h)}N$. Specifically, coefficients z and h are chosen such that (i) sublayer A is under tensile stress; (ii) sublayer B is under compressive stress and compensate some tensile stress from sublayers A. Example coefficients can be set as, for z between 0.08-0.20 and h between 0.06-0.18. The in-plane lattice constant of sublayer A is larger than that of sublayer B by a fraction of a percent, thereby permitting the critical thickness of sublayer A to be large due to close lattice matching.

Calculated lattice mismatch of example RE-III-N materials of different concentration of Sc, are provided in Table 3 below:

TABLE 3

Example Lattice Constants and Lattice mismatch

| Sc % | Al % | a ScAlN, A | mismatch | Mismatch (Percent %) |
|---|---|---|---|---|
| 0.08 | 0.92 | 3.156 | | |
| 0.1 | 0.9 | 3.167 | 0.0035 | 0.35% |
| 0.12 | 0.88 | 3.178 | 0.0035 | 0.35% |
| 0.14 | 0.86 | 3.189 | 0.0034 | 0.34% |
| 0.16 | 0.84 | 3.200 | 0.0034 | 0.34% |
| 0.18 | 0.82 | 3.211 | 0.0034 | 0.34% |
| 0.2 | 0.8 | 3.222 | 0.0034 | 0.34% |

As shown in Table 3, the in-plane lattice constant of cubic ScAlN (111) is smaller as the concentration of Sc is reduced, which allows stress engineering in multilayer structures. For example, when the first transition layer is composed of ScAlN, the crystal structure of ScAlN can be chosen to be different at the upper surface and the lower surface of the first transition layer 106, in order to balance the stress across layers when the two surfaces of the transition layer 106 have different lattice constants. The variation in spacing at the first transition layer 106 may be used for dislocation annihilation closer to interface due to engineered lattice mismatch which provide for a better quality of the III-N layer 108 grown above.

Additionally, in a structure such as that shown in FIG. 8, compressive strain can be caused in the ScAlN layer which may help "buckle" Al—N and Sc—N bonds in the basal plane and increase polarity along c-axis resulting in an increase of the piezoelectric coefficient of the layered structure. The same may be true for other RE-III-N materials. Additionally, an improvement of the coupling factors can be observed for a surface acoustic wave (SAW) device or a thin-film bulk acoustic resonator (FBAR) device. By controlling the lattice mismatch of sublayers A and B, the stress (e.g. tensile and compressive) does not relax. Further, compressive stress can compensate tensile stress that arises between the substrate 102 and the buffer layer 104.

In the example shown in FIG. 9, a molybdenum layer 114 is included between the buffer layer 104 and the first transition layer. The molybdenum layer is made of molybdenum, molybdenum oxide or its derivative and can provide metallic and insulation properties. The first transition layer 106 includes sublayers A and B of $Sc_zAl_{(1-z)}N$ and $Sc_hAl_{(1-h)}N$. Specifically, coefficients z and h are chosen such that (i) sublayer A is under tensile stress; (ii) sublayer B is under compressive stress and compensates some tensile stress from sublayers A. Example coefficients can be set as z between 0.08-0.20 and h between 0.06-0.18. The in-plane lattice constant of sublayer A is larger than that of sublayer B by a fraction of a percent, thereby permitting the critical thickness of sublayer A to be large due to close lattice matching.

In a structure such as that shown in FIG. 9, compressive stress can be caused in the ScAlN layer which will help "buckle" Al—N and Sc—N bonds in the basal plane and increase polarity along c-axis resulting in an increase of the piezoelectric coefficient of the layered structure. The same may be true for other RE-III-N materials. Additionally, an improvement of the coupling factors can be observed for a surface acoustic wave (SAW) device or a thin-film bulk acoustic resonator (FBAR) device. By controlling the lattice mismatch of sublayers A and B, the stress (e.g. tensile and compressive) does not relax. Further, compressive stress can compensate tensile stress that arises between the substrate 102 and the buffer layer 104.

Figure 10:
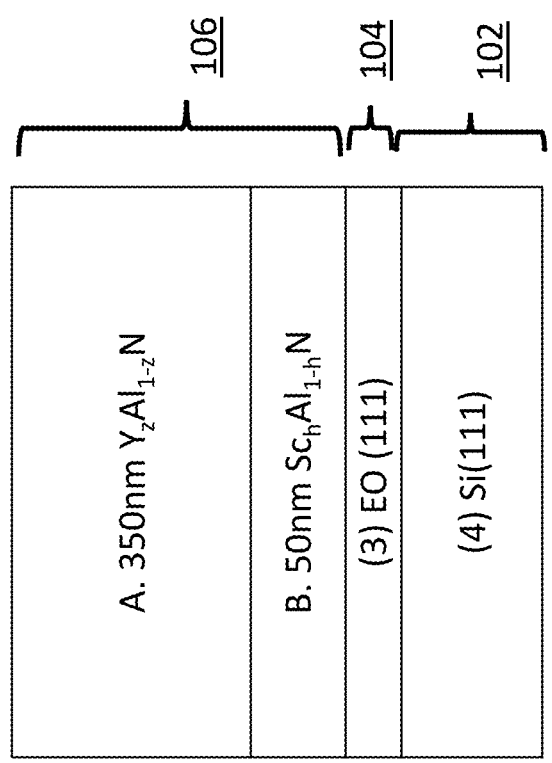
FIG. 10 shows an example composition of the first transition layer and the second transition layer shown in the layered structure that facilitates stress-tuning the epitaxial structure shown in FIG. 1, in accordance with one embodiment of the present disclosure.

In the example shown in FIG. 10, the first transition layer 106 includes sublayers A and B of $Y_zAl_{(1-z)}N$ and $Sc_hAl_{(1-h)}N$. Specifically, coefficients z and h are chosen such that (i) sublayer A is under compressive stress; (ii) the resulting lattice constants of the sublayers satisfy A>B. Example coefficients can be set as z between 0.06-0.24 and h between 0.06-0.24. A lattice constant of YAlN is estimated from atomic radius ratio between Sc and Y atoms. The concentration of Sc must be high to maintain stable ScAlN sublayer, and to permit sublayer of YAlN with high concentration of Y in order for the lattice mismatch to improve piezoelectric performance. It is preferable for the concentration of Y in the sublayer of YAlN to have a concentration of about 20%.

The structure as shown in FIG. 10, can result in compressive strain in the YAlN layer which will help "buckle" Al—N and Y—N bonds in the basal plane and increase polarity along c-axis resulting in an increase of the piezoelectric coefficient of the layered structure. The same may be true of other RE-III-N materials. Additionally, an improvement of the coupling factors can be observed for a surface acoustic wave (SAW) device or a thin-film bulk acoustic resonator (FBAR) device. By controlling the lattice mismatch of sublayers A and B, the stress (e.g. tensile and compressive) does not relax. Further, compressive stress can compensate tensile stress that arises between the substrate 102 and the buffer layer 104.

Figure 11:
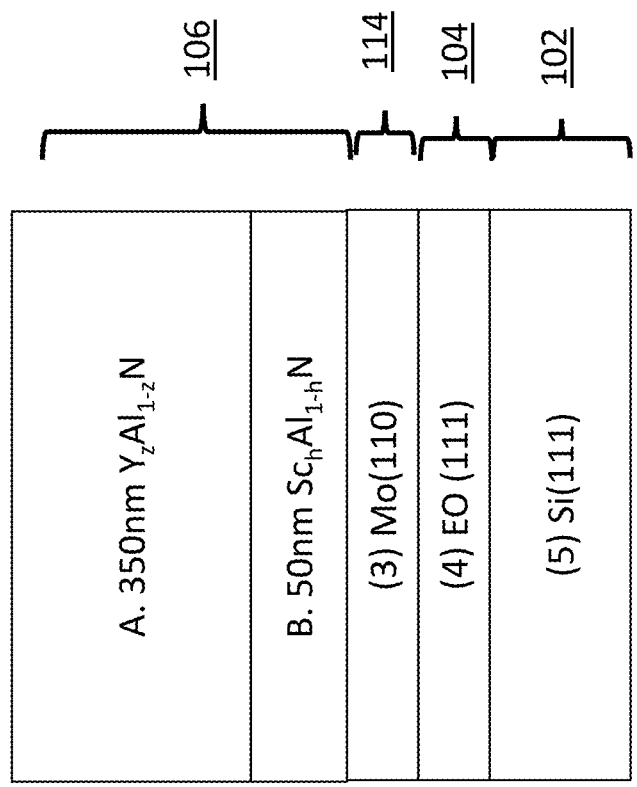
FIG. 11 shows an example composition of multiple layered structure that facilitates stress-tuning to increase piezoelectric coefficient of the epitaxial structure, in accordance with one embodiment of the present disclosure.

In the example shown in FIG. 11 a molybdenum layer 114 is included between the buffer layer 104 and the first transition layer. The molybdenum layer is made of molybdenum, molybdenum oxide or its derivative and can provide metallic and insulation properties. The first transition layer 106 includes sublayers A and B of $Y_zAl_{(1-z)}N$ and $Sc_hAl_{(1-h)}N$. Specifically, coefficients z and h are chosen such that (i) sublayer A is under compressive stress; (ii) the resulting lattice constants of the sublayers satisfy A>B. Example coefficients can be set as z between 0.06-0.24 and h between 0.06-0.24. A lattice constant of YAlN is estimated from atomic radius ratio between Sc and Y atoms. The concentration of Sc must be high to maintain stable ScAlN sublayer to permit YAlN with high concentration of Y in order for the lattice mismatch to improve piezoelectric performance. It is preferable for the concentration of Y in the YAlN sublayer to have a concentration of about 20%.

Figure 12:
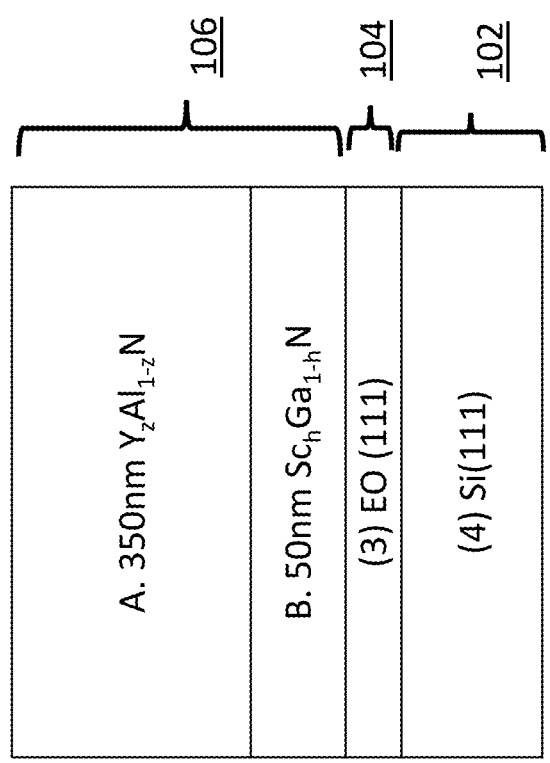
FIG. 12 shows an example composition of multiple layered structure that facilitates stress-tuning to increase piezoelectric coefficient of the epitaxial structure, in accordance with one embodiment of the present disclosure.

In the example shown in FIG. 12, the first transition layer 106 includes sublayers A and B of $Y_zAl_{(1-z)}N$ and $Sc_hGa_{(1-h)}N$. Specifically, coefficients z and h are chosen such that (i) sublayer A is under compressive stress; (ii) the resulting lattice constants of the sublayers satisfy A>B. Example coefficients can be set as z between 0.06-0.24 and h between 0.06-0.24. In the sublayer B, Al is substituted with Ga which permits for a larger lattice constant of the sublayer B, and further allowing a larger lattice constant of sublayer A by using a higher concentration of Y in the sublayer A in order for the lattice mismatch to improve piezoelectric performance. It is preferable for the concentration of Y in the YAlN sublayer to have a concentration of about 20%.

Figure 13:
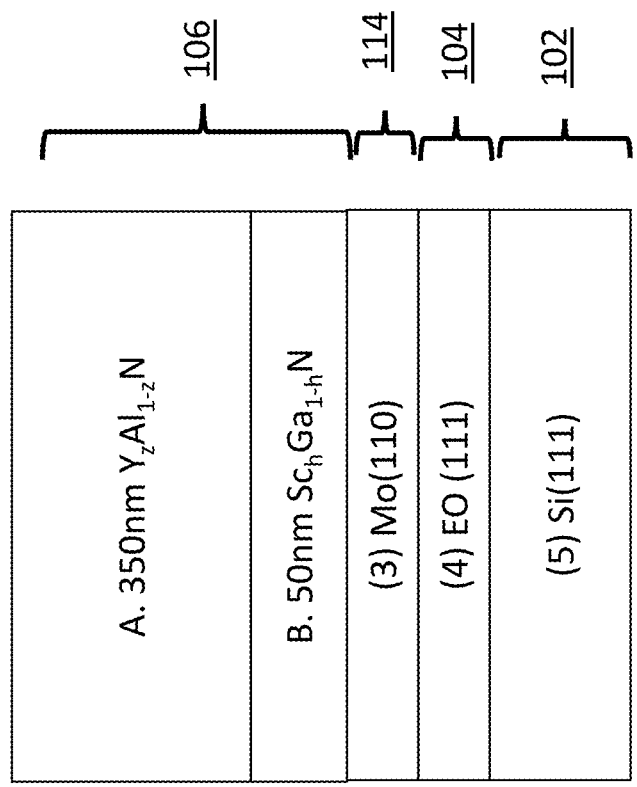
FIG. 13 shows an example composition of alternating layered structure that facilitates stress-tuning to increase piezoelectric coefficient of the epitaxial structure, in accordance with one embodiment of the present disclosure.

In the example shown in FIG. 13, a molybdenum layer 114 is included between the buffer layer 104 and the first transition layer. The molybdenum layer is made of molybdenum, molybdenum oxide or its derivative and can provide metallic and insulation properties. The first transition layer 106 includes sublayers A and B of $Y_zAl_{(1-z)}N$ and $Sc_hGa_{(1-h)}N$. Specifically, coefficients z and h are chosen such that (i) sublayer A is under compressive stress; (ii) the resulting lattice constants of the sublayers satisfy A>B. Example coefficients can be set as z between 0.06-0.24 and h between 0.06-0.24. In the sublayer B, Al is substituted with Ga which permits for a larger lattice constant of the sublayer B, and further allowing a larger lattice constant of sublayer A by using a higher concentration of Y in the sublayer A in order for the lattice mismatch to improve piezoelectric performance.

Additionally, examples illustrated in the FIGS. 12 and 13 permit for sublayers A and B to use two group IIIA elements to improve the lattice constant matching between the sublayers A and B.

Figure 14:
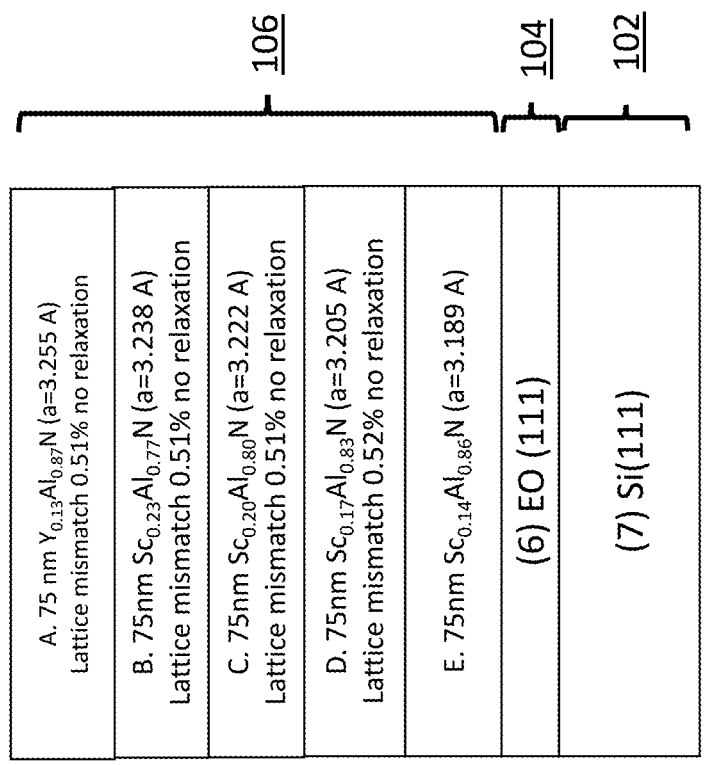
FIG. 14 shows an example composition of multiple layered structure as a super lattice that facilitates stress-tuning to increase piezoelectric coefficient of the epitaxial structure, in accordance with one embodiment of the present disclosure.

In the example shown in FIG. 14, the first transition layer 106 includes plurality of sublayers that allow for higher lattice mismatch between the first sublayer and last sublayer. Specifically, the example in FIG. 14 includes 5 sublayers (A, B, C, D, and E) that employ incremental lattice constant mismatch between adjacent layers. In particular, sublayers B through E employ $Y_zAl_{(1-z)}N$ with sublayer E employing a lower concentration of Sc than in the sublayer D and incrementally increasing the Sc concentration each adjacent sublayer. Finally, sublayer A employs $Y_hAl_{(1-h)}N$. Specifically, coefficients z and h are chosen such that (i) sublayer A-D are under compressive stress; (ii) the resulting lattice constants of the sublayers satisfy A>B>C>D>E. In such a configuration, epitaxial structure can obtain a higher mismatch and is able to introduce larger strain (e.g. tensile and compressive) to the multiple layered structure.

Figure 15:
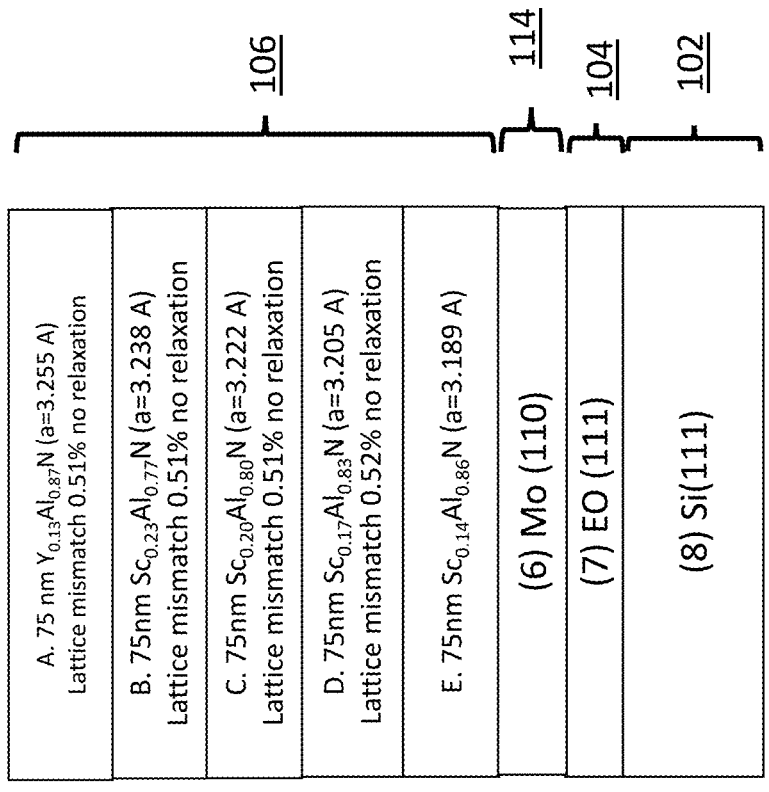
FIG. 15 shows an example composition of multiple layered structure as a super lattice that facilitates stress-tuning to increase piezoelectric coefficient of the epitaxial structure, in accordance with one embodiment of the present disclosure.

In the example shown in FIG. 15, a molybdenum layer 114 is included between the buffer layer 104 and the first transition layer. The molybdenum layer is made of molybdenum, molybdenum oxide or its derivative and can provide metallic and insulation properties. The first transition layer 106 includes plurality of sublayers that allow for higher lattice mismatch between the first sublayer and last sublayer. Specifically, the example in FIG. 15 includes 5 sublayers (A, B, C, D, and E) that employ incremental lattice constant mismatch between adjacent layers. In particular, sublayers B through E employ $Sc_zAl_{(1-z)}N$ with sublayer E employing a lower concentration of Sc and a lower lattice constant than in the sublayer D. In each of the subsequent sublayers, the Sc concentration in $Sc_zAl_{(1-z)}N$ incrementally increasing thereby permitting the lattice constant to increase. Finally, sublayer A employs $Y_hAl_{(1-h)}N$. Specifically, coefficients z and h are chosen such that (i) sublayer A-D are under compressive stress; (ii) the resulting lattice constants of the sublayers satisfy A>B>C>D>E. In such a configuration, epitaxial structure can obtain a higher mismatch and is able to introduce larger strain (e.g. tensile and compressive) to the multiple layered structure thereby allowing an increase of the piezoelectric coefficient.

Figures 16, 17:
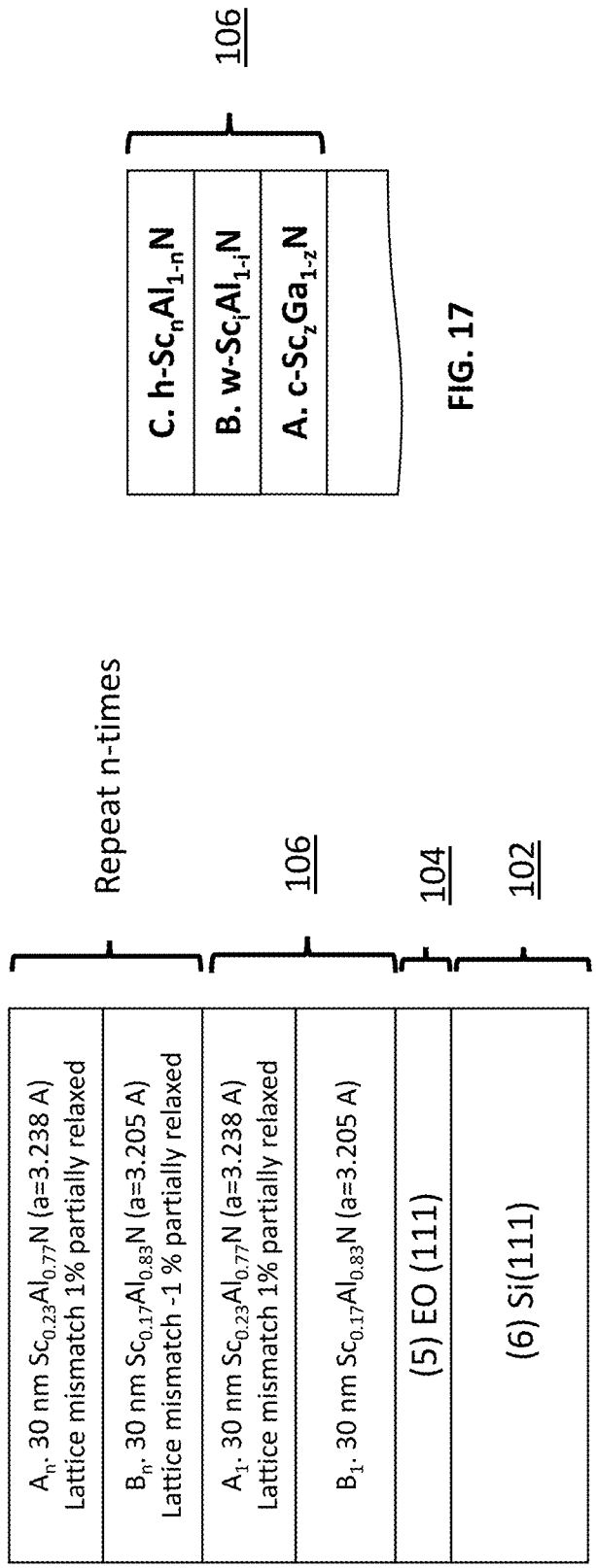
FIG. 16 shows an example composition of the first transition layer that employs repeating sublayers that facilitates stress-tuning the epitaxial structure shown in FIG. 1 in accordance with one embodiment of the present disclosure.
FIG. 17 shows an example composition of the first transition layer that facilitates stress-tuning the epitaxial structure shown in FIG. 1, in accordance with one embodiment of the present disclosure.

In the example shown in FIG. 16, the first transition layer 106 includes sublayers $A_1$ and $B_1$. Subsequently, it is possible provide repeating sublayers that have characteristic similar to sublayers $A_1$ and $B_1$ layered sequentially on top of each other. In such a case, such repeating sublayers $A_n$ and $B_n$ have lattice constants similar to the lattice constants of $A_1$ and $B_1$. Therefore, in such a configuration it is possible to employ alternating layers with tensile strain and compressive strain.

Alloys exhibit electromechanical properties as a function of in-plane strain. In particular, tensile strain can indicate an increasing piezoelectric coefficient while at the same time compressive strain can also indicate an enhancement of piezoelectric coefficient. Further discussion on tensile strain and compressive strain and its impact on piezoelectric coefficient is provided in Alsaad, A. M., et al., "Structural phase transitions and piezoelectric anomalies in ordered $Sc_{0.5}Ga_{0.1}N$ Alloys", *Bull. Mater. Sci.*, Vol. 30, No. 4, August 2007, pp. 407-413, which is hereby expressly incorporated by reference herein in its entirety.

In the example shown in FIG. 17, the first transition layer 106 includes sublayers A-C of $h-Sc_nAl_{(1-n)}N$, $w-Sc_iAl_{(1-i)}N$, and $w-Sc_zGa_{(1-z)}N$. The coefficients n, i, and z are chosen such that (i) the resulting lattice constants of the sublayers satisfy A<B<C; (ii) the sublayer A is under tensile stress because its lattice constant is smaller than the lattice constant of the substrate 102 or buffer 104; and (iii) the sublayer B and C are under compressive stress because its lattice constant is larger than that of sublayer A. Example coefficients can be set as n between 0.15-0.5, i between 0.10-0.5, z between 0-0.15. In some implementations, critical thickness of sublayers B and C can be large due to close lattice matching.

Figure 18:
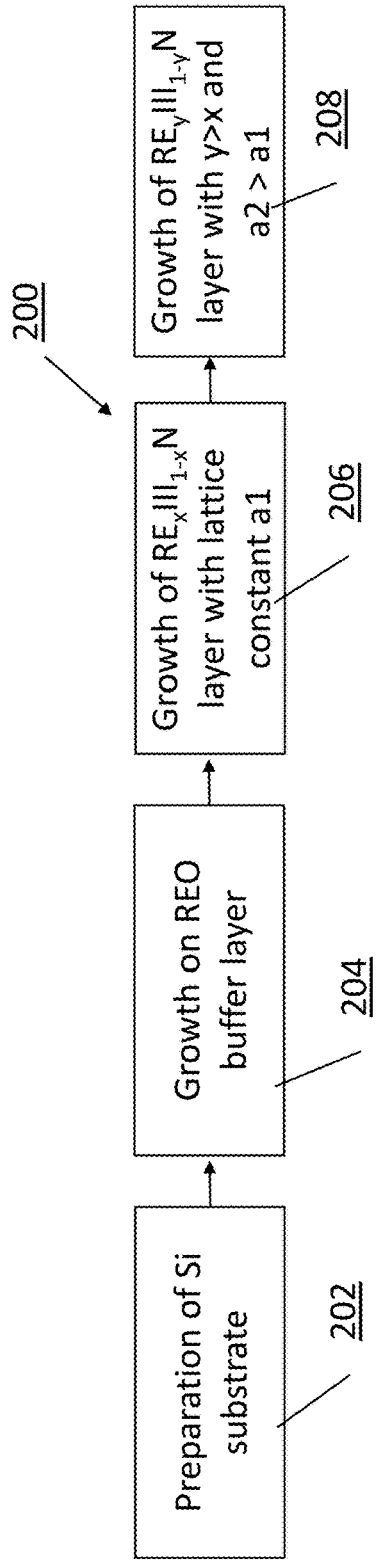
FIG. 18 is a flow diagram of an illustrative process for making a layered structure, in accordance with some embodiments of the present disclosure.

FIG. 18 is a flow diagram of illustrative process 200 for making a layered structure, in accordance with some embodiments of the present disclosure. Process 200 includes forming a layered structure with a piezoelectric coefficient, wherein the layered structure is formed sequentially by making each of the layers.

In some embodiments, a substrate is prepared at 202 in a suitable reactor chamber for forming an III-nitride structure over the substrate. The substrate may include gallium nitride, silicon carbide, sapphire, a silicon wafer, or any other suitable substrate, having a predetermined crystallographic orientation. At 204, a rare earth oxide or rare earth nitride buffer layer is grown over the substrate. In some embodiments, the III-nitride structure (e.g., a HEMT structure) includes one or more epitaxial layers formed over the substrate. The deposition conditions for the III-nitride structure are selected so that smooth interfaces are formed between the layers of the structure. A first transition layer 106 is grown in stages having a number of sublayers. First a $RE_xIII_{1-x}N$ sublayer with lattice constant a1 is grown at 206 over the buffer layer. Subsequently, a second sublayer with a concentration of REyIII1-yN and a lattice constant a2 is grown at 208 over the first sublayer. The second sublayer is grown such that it satisfies y>x and a2>a1.

Figure 19:
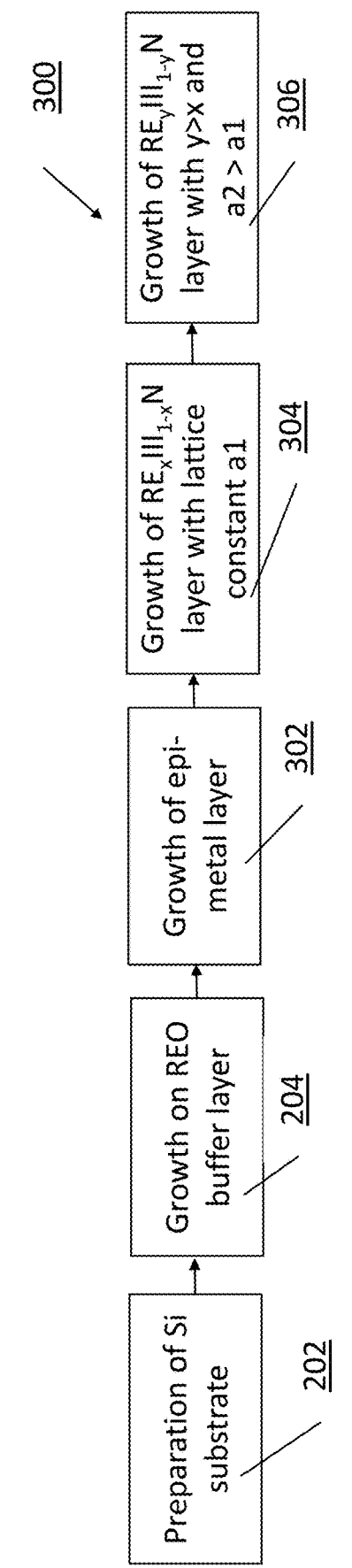
FIG. 19 is a flow diagram of an illustrative process for making a layered structure with a preparatory layer, in accordance with some embodiments of the present disclosure.

FIG. 19 is a flow diagram of illustrative process 300 for making a layered structure, in accordance with some embodiments of the present disclosure. Process 300 includes forming a layered structure with a piezoelectric coefficient, wherein the layered structure is formed sequentially by making each of the layers.

In some embodiments, a substrate is prepared at 202 in a suitable reactor chamber for forming an III-nitride structure over the substrate. The substrate may include gallium nitride, silicon carbide, sapphire, a silicon wafer, or any other suitable substrate, having a predetermined crystallographic orientation. At 204, a rare earth oxide or rare earth nitride buffer layer is grown over the substrate. In some embodiments, the III-nitride structure (e.g., a HEMT structure) includes one or more epitaxial layers formed over the substrate. The deposition conditions for the III-nitride structure are selected so that smooth interfaces are formed between the layers of the structure. An epi-metal layer is grown at 302 over the rare earth oxide or rare earth nitride buffer layer. A first transition layer 106 is grown in stages having a number of sublayers. First a $RE_xIII_{1-x}N$ sublayer with lattice constant a1 is grown at 304 over the buffer layer. Subsequently, a second sublayer with a concentration of $RE_yIII_{1-y}N$ and a lattice constant a2 is grown at 306 over the first sublayer. The second sublayer is grown such that it satisfies y>x and a2>a1.

Figure 20:
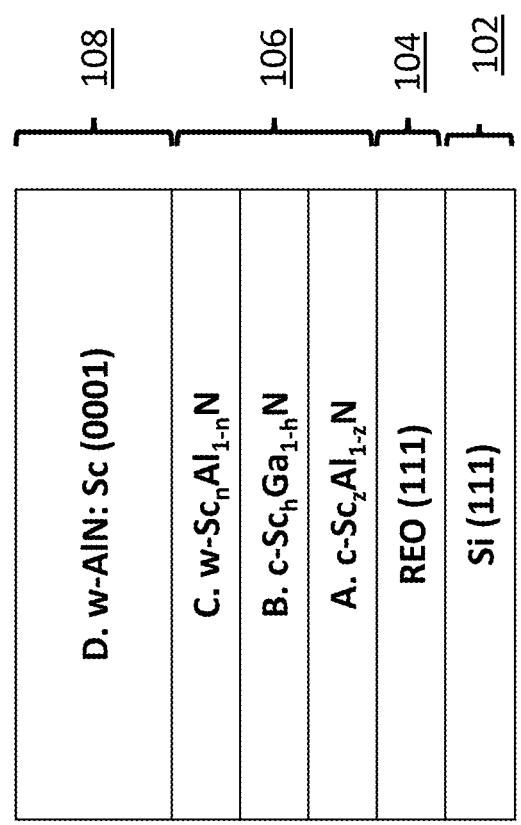
FIG. 20 shows an example composition of the first transition layer and the second transition layer shown in the layered structure in FIG. 1, in accordance with one embodiment of the present disclosure.

FIG. 20 shows an example composition of the first transition layer and the second transition layer shown in the layered structure in FIG. 1, according to one embodiment described herein. In the example shown in FIG. 8, the substrate 102 is composed of silicon <111>. The buffer layer 104 is composed of REO or REN <111>. Example REO or REN used at the buffer layer 104 includes $Er_2O_3$ <111>, $Sc_2O_3$ <111>, ErN <111>, ScN <111>. The first transition layer 106 includes sublayers A-C of $c-Sc_zAl_{(1-z)}N$, $c-Sc_hGa_{(1-h)}N$, and $w-Sc_nAl_{(1-n)}N$. Specifically, coefficients z, h, and n are chosen such that (i) sublayer A is under tensile stress; (ii) sublayers B and C are under compressive stress and compensate some tensile stress from sublayers A and layer D.

At the second transition layer 108, rare earth surfactant mediated III-N epitaxy may be used. As the Sc—N bond is weaker than Al—N or Ga—N (4.87 eV vs 11.52 eV and 8.92 eV, respectively), Sc atoms can act as surfactants during AlN epitaxy at the second transition layer 108, which helps to achieve better surface morphology of III-N:RE layers. Specifically, ScN (similar to InN) does not require as a high growth temperature as AlN. Therefore, using Sc as surfactant at the second transition layer 108 may permit a lower growth temperature, which reduces thermal stress related to thermal expansion difference between the semiconductor layer (e.g. AlN) and a substrate (Si). When the Sc is added as surfactants, the flux ratio of Sc to Al should be <0.01. Therefore, the second transition layer 108 can be composed of w-AlN:Sc<0001>. The second transition layer 108 is under tensile stress. The second transition layer 108 is grown at a lower temperature than a typical AlN layer. Part of the tensile stress at the second transition layer 108 is compensated by sublayers B and C. Concentration of Sc in the second transition layer 108 is chosen to be <1%.

The surfactant mediated epitaxy can be used for growth of polar, non-polar or semi-polar orientation of AlN on Si <111> or Si <100> via REO (110) epi-twist. Further discussion on growth of non-polar AlGaN using In as surfactant is provided in "Optical Materials Express" 8, 309687 (2017), *J. Mater Sci: Mater. Electron.* 28, 15217 (2017)), which is hereby expressly incorporated by reference herein in its entirety.

Figure 21:
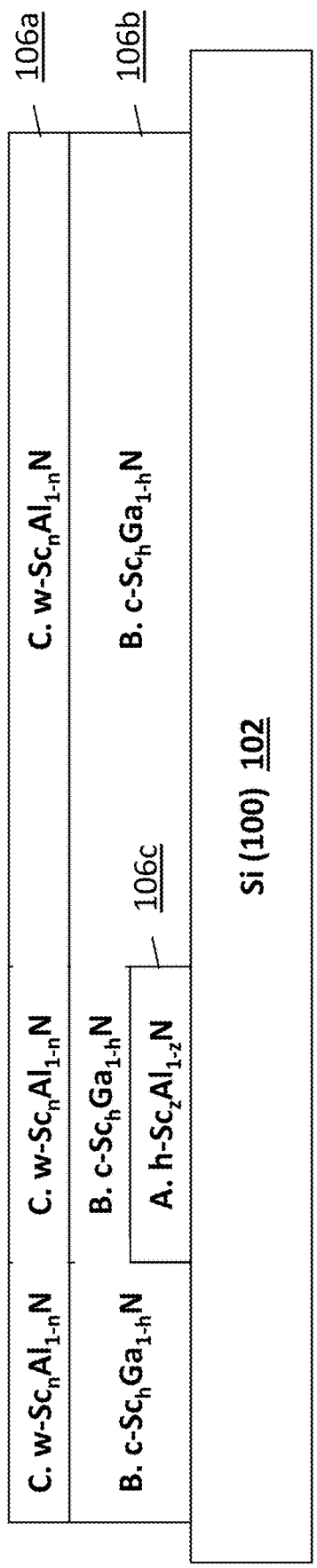
FIG. 21 shows an example structure illustrating growth of different stressed layers in a field-effect transistor (FET) structure using the first transition composition similar to FIG. 6, in accordance with one embodiment of the present disclosure.
Figure 22:
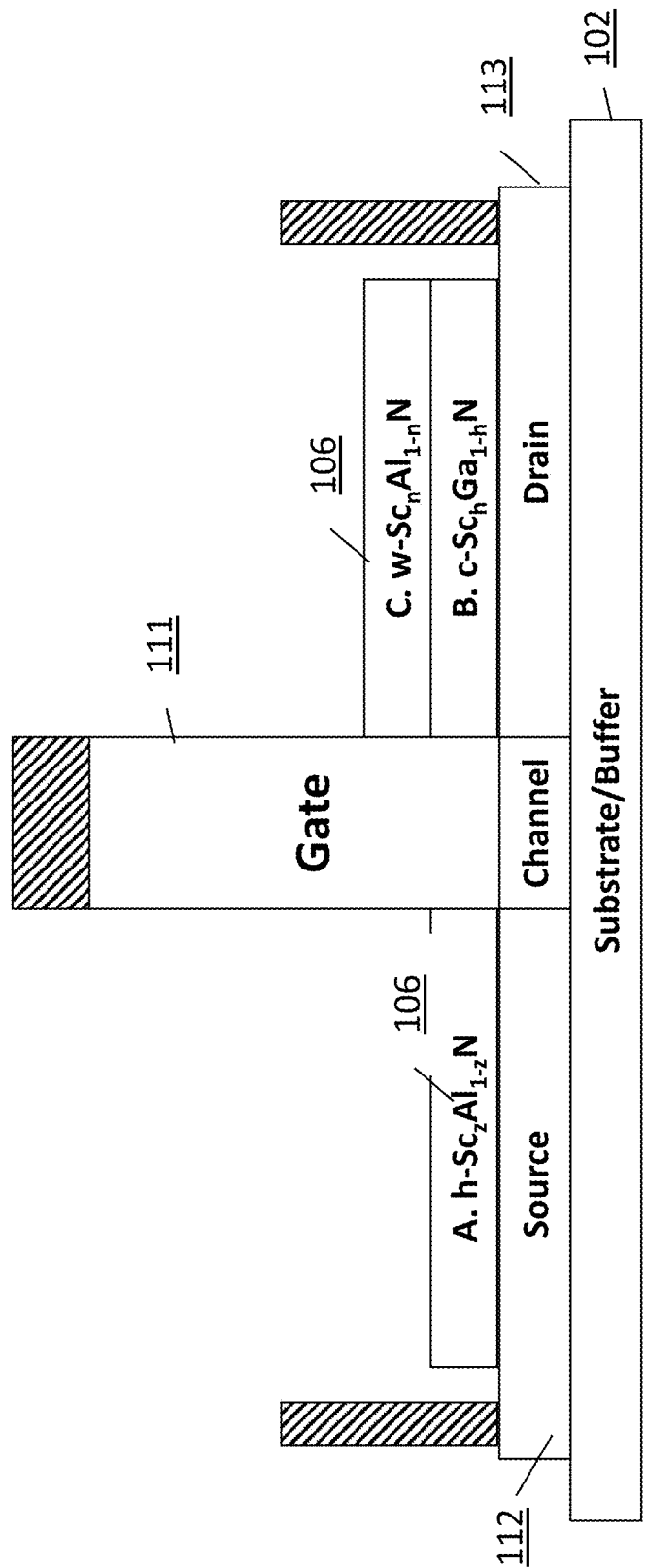
FIG. 22 shows an alternative example structure illustrating FET integration using the first transition composition similar to FIG. 6, in accordance with one embodiment of the present disclosure.

FIG. 21 shows an example structure illustrating growth of different stressed layers in a field-efficient transistor (FET)

structure using the first transition composition similar to FIG. 6, according to one embodiment described herein. The first transition layer may have sublayers 106*a-c*, each of which may only align partially with the other sublayers for FET device integration. For example, as shown in FIG. 22, sublayer A of h-$Sc_zAl_{(1-z)}N$ 106*c* may only align a part of sublayer B of c-$Sc_hGa_{(1-h)}N$ 106*b*. Thus, the structure shown in FIG. 22 may be used as a FET, at which the source 112, drain 113 and gate 111 of the FET can be placed at different regions of stressed epitaxial structure, respectively. For example, the source may be a tensile stressed epitaxial layer (e.g., at sublayer A 106*c*), while the drain may be a compressively stressed epitaxial layer (e.g., sublayers B or C).

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially-uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire. A substrate may have a single bulk wafer, or multiple sub-layers. Specifically, a silicon substrate may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers.

Specifically, a silicon semiconductor layer may include multiple non-continuous porous portions. The multiple non-continuous porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure, comprising:
   a substrate;
   a rare earth containing buffer layer disposed over the substrate; and
   a III-N rare earth transition layer disposed over the rare earth containing buffer layer,
   wherein the III-N rare earth transition layer comprises:
      a plurality of sublayers, each sublayer having an in-plane lattice constant,
      wherein a first sublayer of the plurality of sublayers has a first in-plane lattice constant at an upper surface of the III-N rare earth transition layer,
      wherein a second sublayer of the plurality of sublayers has a second in-plane lattice constant at a lower surface of the III-N rare earth transition layer, the lower surface coupled to the rare earth containing buffer layer and opposite the upper surface, and
      wherein the first in-plane lattice constant is less than the second in-plane lattice constant.

2. The layered structure of claim 1, wherein the rare earth containing buffer layer is selected from a group consisting of a rare earth oxide or a rare earth nitride.

3. The layered structure of claim 2, wherein:
   the rare earth containing buffer layer has a first in-plane lattice constant at an upper surface of the rare earth containing buffer layer, the upper surface coupled to the III-N rare earth transition layer,
   the rare earth containing buffer layer has a second in-plane lattice constant at a lower surface of the rare earth containing buffer layer, the lower surface coupled to the substrate, and
   the first in-plane lattice constant is less than the second in-plane lattice constant.

4. The layered structure of claim 1, wherein the III-N rare earth transition layer comprises at least three sublayers of ScAlN and ScGaN.

5. The layered structure of claim 4, wherein each of the multiple sublayers has one of a cubic structure, a simple hexagonal structure, or a wurtzite hexagonal structure.

6. The layered structure of claim 1, further comprising a second III-N rare earth transition layer disposed over the III-N rare earth transition layer, wherein the second III-N rare earth transition layer comprises an AlN grown with Sc as surfactant.

7. The layered structure of claim 4, wherein:
   a first sublayer at a lower end of the III-N rare earth transition layer has a first in-plane lattice constant,
   a second sublayer disposed over the first sublayer at a middle of the III-N rare earth transition layer has a second in-plane lattice constant,
   a third sublayer disposed over the second sublayer at an upper end of the III-N rare earth transition layer has a third in-plane lattice constant
   the first in-plane lattice constant is less than the second in-plane lattice constant and
   the second in-plane lattice constant is less than the third in-plane lattice constant.

8. The layered structure of claim 1, wherein the III-N rare earth transition layer comprises multiple sublayers of ScAlN, and a crystal structure of ScAlN is different at the upper surface of the III-N rare earth transition layer and at the lower surface of the III-N rare earth transition layer.

9. The layered structure of claim 6, wherein the second III-N rare earth transition layer is doped with rare earth (RE) to control surface mobilities and lattice dynamics.

10. The layered structure of claim 1, wherein the III-N rare earth transition layer comprises:
    a first sublayer of h-$Sc_aGa_{(1-a)}N$,
    a second sublayer of h-$Sc_hAl_{(1-n)}N$, and
    a third sublayer of w-$Sc_nAl_{(1-n)}N$,
    wherein the sublayers are stacked on top of each other in a sequential order,
    wherein a coefficient h of the second sublayer is greater than coefficient n of the third sublayer,
    wherein an in-plane lattice constant of the first sublayer is greater than an in-plane lattice constant of the second layer, and
    wherein the in-plane lattice constant of the second layer is greater than an in-plane constant of the third layer.

11. The layered structure of claim 1, wherein the III-N rare earth transition layer is a piezoelectric layer.

12. The layered structure of claim 1, wherein the III-N rare earth transition layer is under compressive stress to increase a piezoelectric coefficient.

13. The layered structure of claim 1, wherein the III-N rare earth transition layer is under tensile stress to increase a piezoelectric coefficient.

14. The layered structure of claim 1, wherein the III-N rare earth transition layer comprises a sublayer A of $Sc_zAl_{(1-z)}N$ and a sublayer B of $Sc_hAl_{(1-h)}N$, wherein a coefficient z of sublayer A and a coefficient h of sublayer B are chosen such that the sublayers satisfy the following:
    (i) sublayer A is under tensile stress; and
    (ii) sublayer B is under compressive stress.

15. The layered structure of claim 14, wherein the coefficients can be set as z in a range of 0.08-0.20 and h in a range of 0.06-0.18.

16. The layered structure of claim 1, wherein the III-N rare earth transition layer comprises a sublayer A of $Y_zAl_{(1-z)}N$ and a sublayer B of $Sc_hAl_{(1-h)}N$, wherein coefficients z and h are chosen such that the sublayers satisfy the following:
    (i) sublayer A is under compressive stress; and
    (ii) the resulting lattice constants of each of the sublayers satisfy A>B.

17. The layered structure of claim 1, wherein the III-N rare earth transition layer comprises:
    a first sublayer disposed over the rare earth containing buffer layer
    a second sublayer disposed over the first sublayer and having an in-plane lattice constant higher than the in-plane lattice constant of the second first sublayer;

a third sublayer disposed over the second sublayer and having an in-plane lattice constant less than the in-plane lattice constant of the second sublayer; and a fourth sublayer disposed over the third sublayer and having an in-plane lattice constant greater than the in-plane lattice constant of the third sublayer, wherein the first sublayer, second sublayer, third sublayer, and fourth sublayer have an alternating in-plane lattice constant, and wherein the alternating in-plane lattice constant increases the piezoelectric coefficient.

18. The layered structure of claim 1, further comprising:
a source electrode and a drain electrode disposed over the rare earth containing buffer layer;
a channel layer disposed over the rare earth containing buffer layer and disposed between the source and drain electrodes; and
a gate electrode disposed over the channel layer,
wherein each sublayer of the plurality of sublayers of the III-N rare earth transition layer is disposed over the source electrode, the drain electrode, or both.

19. A method of growing a layered structure, the method comprising:
configuring a substrate;
epitaxially growing a rare earth containing buffer layer over the substrate; and
epitaxially growing a rare earth transition layer over the rare earth containing buffer layer with an in-plane lattice constant al,
wherein the rare earth containing buffer layer has a first in-plane lattice constant at an upper surface of the rare earth containing buffer layer, the upper surface coupled to the rare earth transition layer,
wherein the rare earth containing buffer layer has a second in-plane lattice constant at a lower surface of the rare earth containing buffer layer, the lower surface coupled to the substrate, and
wherein the first in-plane lattice constant is less than the second in-plane lattice constant.

20. A layered structure, comprising:
a substrate;
a rare earth containing buffer layer disposed over the substrate; and
a rare earth transition layer disposed over the rare earth containing buffer layer, the III-N rare earth transition layer having an in-plane lattice constant al,
wherein the rare earth containing buffer layer has a first in-plane lattice constant at an upper surface of the rare earth containing buffer layer, the upper surface coupled to the rare earth transition layer,
wherein the rare earth containing buffer layer has a second in-plane lattice constant at a lower surface of the rare earth containing buffer layer, the lower surface coupled to the substrate, and
wherein the first in-plane lattice constant is less than the second in-plane lattice constant.

21. The method of claim 19, further comprising:
forming a source electrode and a drain electrode over the rare earth containing buffer layer;
forming a channel layer over the rare earth containing buffer layer and between the source and drain electrodes; and
forming a gate electrode over the channel layer, wherein the III-N rare earth transition layer comprises a plurality of sublayers, each sublayer epitaxially grown over the source electrode, the drain electrode, or both.

22. The layered structure of claim 20, further comprising:
a source electrode and a drain electrode disposed over the rare earth containing buffer layer;
a channel layer disposed over the rare earth containing buffer layer and disposed between the source and drain electrodes; and
a gate electrode disposed over the channel layer,
wherein the III-N rare earth transition layer comprises a plurality of sublayers, each sublayer disposed over the source electrode, the drain electrode, or both.

* * * * *

UNITED STATES PATENT AND TRADEMARK OFFICE
CERTIFICATE OF CORRECTION

PATENT NO. : 11,063,114 B2
APPLICATION NO. : 16/688162
DATED : July 13, 2021
INVENTOR(S) : Dargis et al.

Page 1 of 2

It is certified that error appears in the above-identified patent and that said Letters Patent is hereby corrected as shown below:

In the Specification

Table 2, Column 4, Line 31, "w-SC$_x$Ga$_{(1-x)}$N" should be --w-Sc$_x$Ga$_{(1-x)}$N--.

Column 5, Line 26, "h-Sc$_f$Al$_{(1-n)}$N" should be --h-Sc$_n$Al$_{(1-n)}$N--.

In the Claims

Claim 7, Column 14, Line 6, "constant" should be --constant,--.

Claim 7, Column 14, Line 8, "constant" should be --constant,--.

Claim 10, Column 14, Line 23, "h-Sc$_h$Al$_{(i-n)}$N" should be --h-Sc$_h$Al$_{(1-h)}$N--.

Claim 14, Column 14, Lines 44-45, "Sc$_z$Al$_{(1-2)}$N" should be --Sc$_z$Al$_{(1-z)}$N--.

Claim 14, Column 14, Line 45, "Sc$_h$Al$_{(i-h)}$N" should be --Sc$_h$Al$_{(1-h)}$N--.

Claim 16, Column 14, Lines 54-55, "Y$_z$Al$_{(i-z)}$N" should be --Y$_z$Al$_{(1-z)}$N--.

Claim 16, Column 14, Line 55, "Sc$_h$Al$_{(i-h)}$N" should be --Sc$_h$Al$_{(1-h)}$N--.

Claim 17, Column 14, Line 64, "layer" should be --layer;--.

Claim 17, Column 14, Line 67, "the second first" should be --the first--.

Claim 19, Column 15, Line 27, "rare" should be --III-N rare--.

Claim 19, Column 15, Line 33, "rare" should be --III-N rare--.

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*

Claim 20, Column 16, Line 5, "rare" should be --III-N rare--.

Claim 20, Column 16, Line 11, "rare" should be --III-N rare--.